United States Patent [19]

Fukuhama et al.

[11] Patent Number: 4,916,666

[45] Date of Patent: Apr. 10, 1990

[54] DYNAMIC RANDOM ACCESS MEMORY DEVICE AND OPERATING METHOD THEREFOR

[75] Inventors: Ryouji Fukuhama; Hideshi Miyatake, both of Hyogo, Japan

[73] Assignee: Mitsubishi Denki Kabushiki Kaisha, Tokyo, Japan

[21] Appl. No.: 261,021

[22] Filed: Oct. 20, 1988

[30] Foreign Application Priority Data

Nov. 17, 1987 [JP] Japan .................................. 62-291318

[51] Int. Cl.⁴ .............................................. G11C 7/00
[52] U.S. Cl. .................................... 365/207; 365/149; 365/205
[58] Field of Search ............... 365/149, 150, 202, 182, 365/210, 189.04, 207, 208, 206, 205

[56] References Cited

U.S. PATENT DOCUMENTS 4,476,547  10/1984  Miyasaka ............................ 365/205
4,748,596   5/1988  Ogura et al. ........................ 365/205

Primary Examiner—Joseph A. Popek
Attorney, Agent, or Firm—Lowe, Price, Leblanc, Becker & Shur

[57] ABSTRACT

In a DRAM device in accordance with the present invention, when a memory cell is selected for reading or writing data, at least one of the bit lines adjacent to the bit lines related with the selected memory cell is not selected simultaneously. Consequently, loss in a sense margin due to capacitance coupling between adjacent bit lines can be reduced.

11 Claims, 11 Drawing Sheets

DYNAMIC RANDOM ACCESS MEMORY DEVICE AND OPERATING METHOD THEREFOR

BACKGROUND OF THE INVENTION

1. Field of the Invention

The present invention relates to a dynamic random access memory (hereinafter referred to as DRAM) device on a semiconductor substrate and more particularly to a method of and a circuitry for a reduction of loss in a sense margin caused by capacitance coupling between bit lines of a DRAM device. Here, the sense margin Vs is defined as Vs=Vb−Vm, where Vb denotes a potential difference between a pair of bit lines, and Vs denote a minimum potential difference which can be sensed and amplified by a sense amplifier of a DRAM device.

2. Description of the Prior Art

Figure 1:
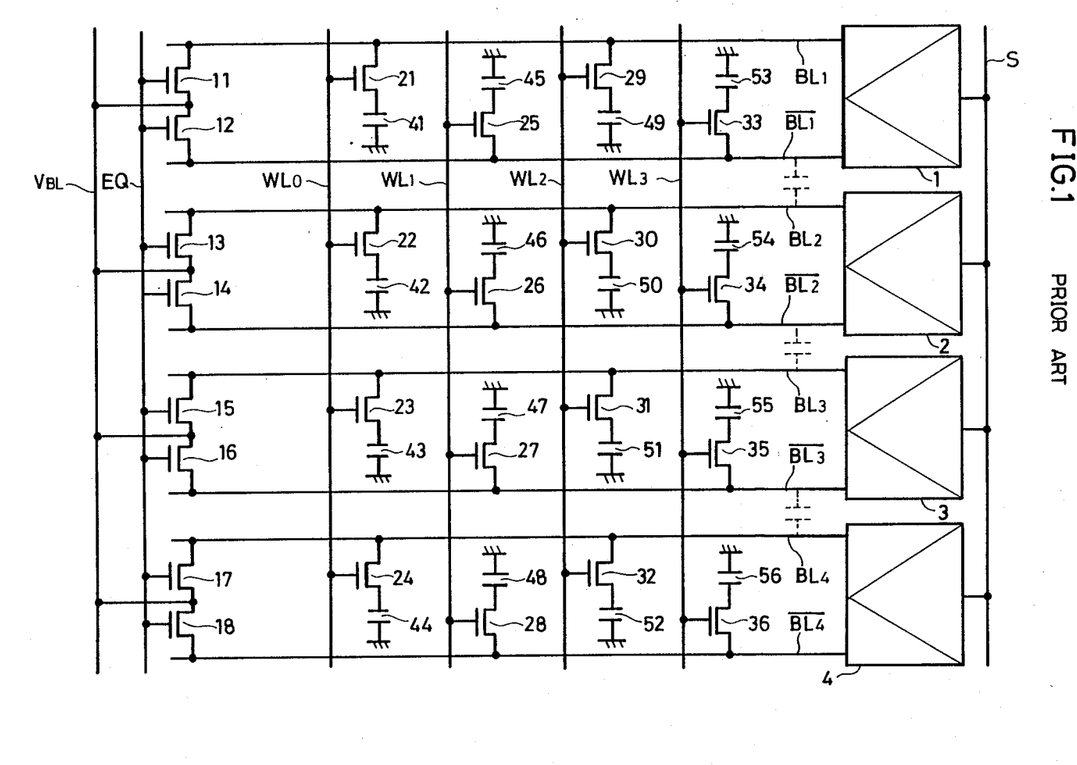
FIG. 1 is a circuit diagram showing a portion of a conventional DRAM device.

FIG. 1 is a circuit diagram for illustrating a portion of a conventional DRAM device. This diagram shows an array of memory cells including memory capacitors 41 to 56 and transfer FETs 21 to 36 corresponding thereto, respectively. Pairs of bit lines adjacent to each other on a semiconductor substrate, namely, BL1 and $\overline{BL1}$, BL2 and $\overline{BL2}$, BL3 and $\overline{BL3}$, and BL4 and $\overline{BL4}$ are connected to sense amplifiers 1, 2, 3 and 4, respectively, so as to read and write data from and into memory cells selected by word lines WL0, WL1, WL2 and WL3, respectively. The sense amplifiers are activated by means of a signal line S. The pairs of bit lines can be equalized by means of a signal line EQ through FETs 11 to 18. During the equalizing period, a voltage Vcc/2 is applied to each bit line by means of a signal line $V_{BL}$. The capacitance coupling between the bit line pairs is represented by phantom lines.

Figure 2:
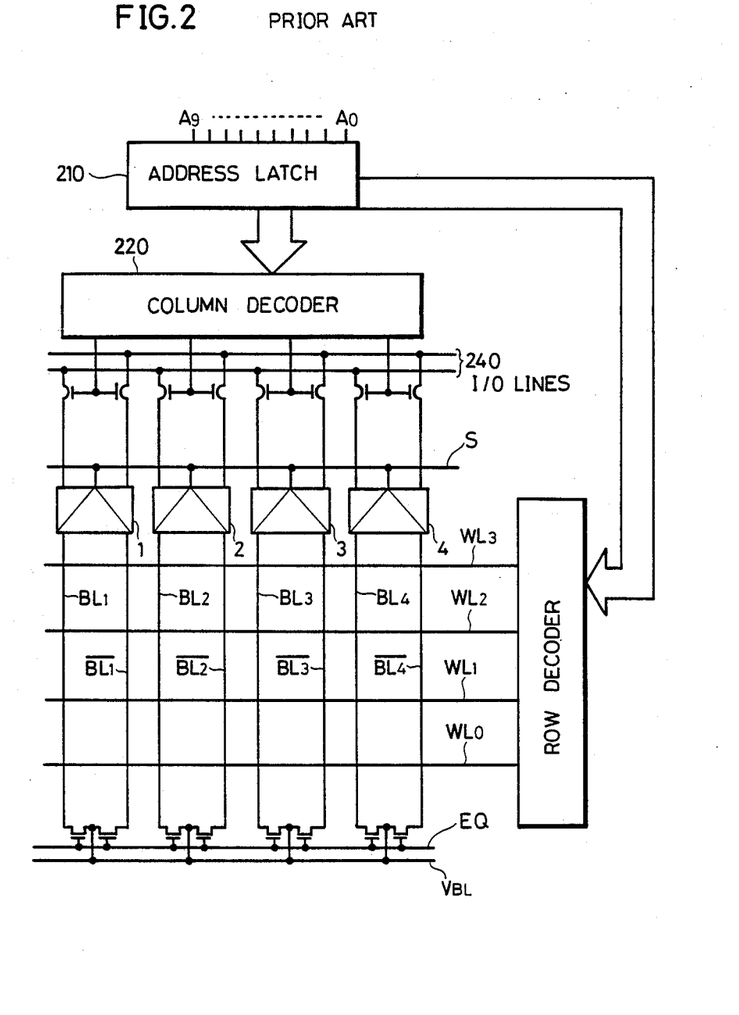
FIG. 2 is a block diagram showing a peripheral circuitry for the DRAM device of FIG. 1.

FIG. 2 is a block diagram showing a peripheral circuitry for the DRAM device of FIG. 1. An address latch 210 is provided with address signals A0 to A9. Based on the address signals, a column decoder 210 selects a bit line pair and similarly a row decoder 230 selects a word line so that a particular memory cell may be selected.

Figure 3:
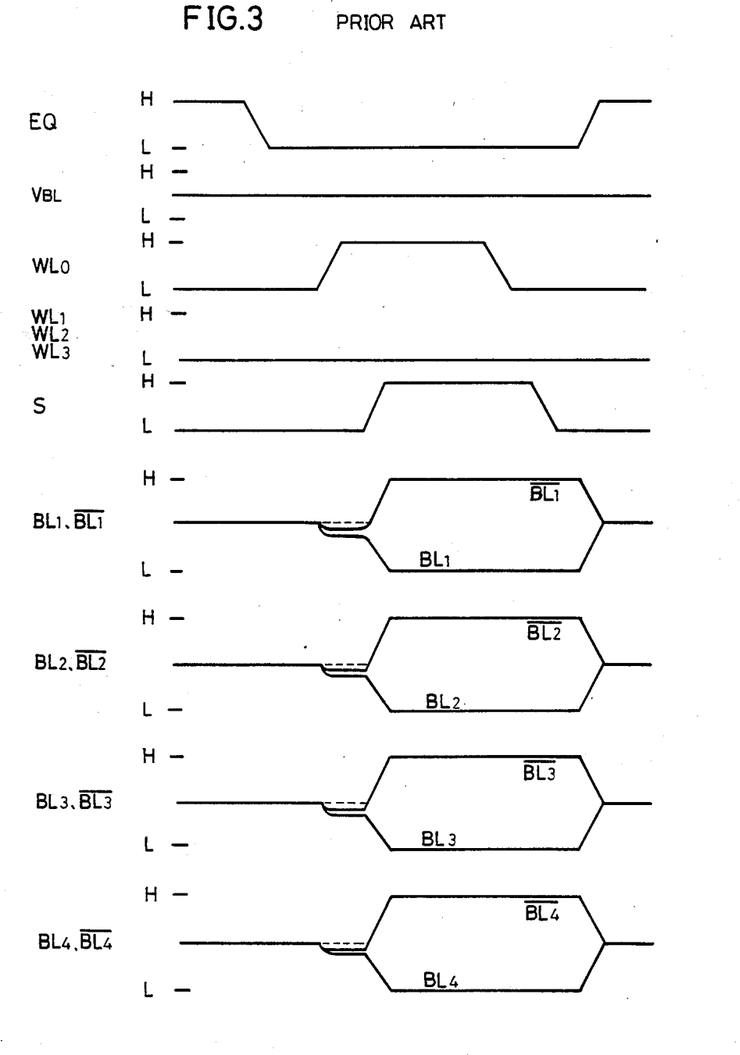
FIG. 3 is a diagram showing waveforms on signal lines in the DRAM device of FIG. 1.

FIG. 3 is a signal waveform diagram on the respective signal lines of the DRAM device of FIG. 1. One of the bit lines of each pair which was at a ground potential GND and the other bit line of each pair which was at a voltage Vcc are equalized during a high (H) level of the equalizing signal EQ and they are reliably set at Vcc/2 by means of the signal line $V_{BL}$. If the selected word line WL0 rises to the H level after the equalizing signal EQ has fallen to a low (L) level, data stored in the memory capacitors 41, 42, 43 and 44 are read out through the bit lines BL1, BL2, BL3 and BL4, respectively. If capacitance coupling between the respective bit lines can be disregarded, the bit line $\overline{BLn}$ (n being an integer) is at a potential shown by a broken line in FIG. 3. However, in a practically utilized DRAM device, an interline capacitance forms a large proportion in a parasitic capacitance of bit lines and accordingly a bit line $\overline{BLn}$ has a potential a little lower than the broken line as shown by a corresponding solid line in FIG. 3 due to a low voltage for reading an adjacent bit line BLn−1. As a result, a loss is caused in a sense margin which corresponds to a potential difference between the bit lines BLn and $\overline{BLn}$.

Then, when the signal S for activating the sense amplifiers rises to the H level, the sense amplifiers 1, 2, 3 and 4 are activated to cause the bit lines BL1, BL2, BL3 and BL4 of a low level to be at the ground potential GND (L level) and the bit lines $\overline{BL1}$, $\overline{BL2}$, $\overline{BL3}$ and $\overline{BL4}$ of a high level to be at the potential Vcc (H level). Then, data of the memory cells related to the corresponding pairs of bit lines are read out through input-/output lines (not shown). Before the selected word line WL0 falls again to the L level, the data are written again in the memory capacitors 41, 42, 43 and 44 at the ground level GND and the sense amplifier activation signal S falls again to the L level.

After that, when the equalizing signal EQ attains the H level, on bit line of each pair at the ground potential GND and the other bit line of each pair at the potential Vcc are equalized so that are reliably at the potential Vcc/2 through the signal line $V_{BL}$.

Thus, the conventional DRAM device performs the reading operation and the refresh operation.

The integration scale of DRAMs is increased every year and a spacing of bit lines is decreased accordingly. Since the spacing of bit lines becomes small, a capacitance coupling between the bit lines is further increased and a loss is caused in a sense margin, resulting in an increase of a soft error ratio. The soft error is mainly caused by α-rays. When α-rays hit a semiconductor DRAM, electron and hole pairs are generated. The generated electrons are collected into bit lines due to an electric field. The thus collected electrons change the potential of the bit lines. Therefore, when the sense margin is small, soft errors may be caused at a higher ratio.

SUMMARY OF THE INVENTION

In view of the above described disadvantages of the prior art, an object of the present invention is to provide a DRAM device in which little loss is caused in a sense margin due to a capacitance coupling between bit lines.

Another object of the present invention is to provide a method of operating a DRAM device to reduce the effect of capacitance coupling between bit lines thereof.

A further object of the present invention is to reduce the effect of soft errors in a DRAM device.

A still further object of the present invention is to improve a sense margin of a DRAM device, without substantially increasing completely thereof.

According to an aspect of the present invention, a dynamic random access memory device formed on a major surface of a semiconductor substrate comprises: an array of memory cells arranged in rows and columns; a plurality of bit line pairs coupled to columns of the memory cells, the plurality of bit line pairs comprising a plurality of first bit line pairs and a plurality of second bit line pairs, the first bit line pairs interposed respectively between the second bit line pairs so that the first and second bit line pairs alternate; a plurality of word lines coupled respectively to rows of the memory cells; equalizing circuit coupled to the plurality of bit line pairs for equalizing the pairs; first and second sense amplifiers coupled respectively to the first and second bit line pairs; and control circuit for activating alternatively the first and second sense amplifiers.

According to another aspect of the present invention, in a dynamic random access memory device comprising an array of memory cells arranged in rows and columns; a plurality of bit line pairs coupled to columns of the memory cells, the plurality of bit line pairs comprising a plurality of first bit line pairs and a plurality of second bit line pairs, the first bit line pairs interposed respectively between the second bit line pairs so that the first and second bit line pairs alternate; a plurality of word lines coupled respectively to rows of the memory cells; equalizing circuit coupled to the plurality of bit line pairs for equalizing the pairs; and sense amplifiers coupled to the plurality of bit line pairs; a method of reading data into said memory device, comprises the steps of: controlling the sense amplifiers to access alternatively the first and second bit line pairs so that adjacent bit line pairs are not accessed simultaneously; and detecting outputs of the sense amplifiers.

Accordingly, loss in a sense margin due to capacitance coupling between the adjacent bit lines can be reduced.

These objects and other objects, features, aspects and advantages of the present invention will becomes more apparent from the following detailed description of the present invention when taken in conjunction with the accompanying drawings.

DESCRIPTION OF THE PREFERRED EMBODIMENTS

Figure 4:
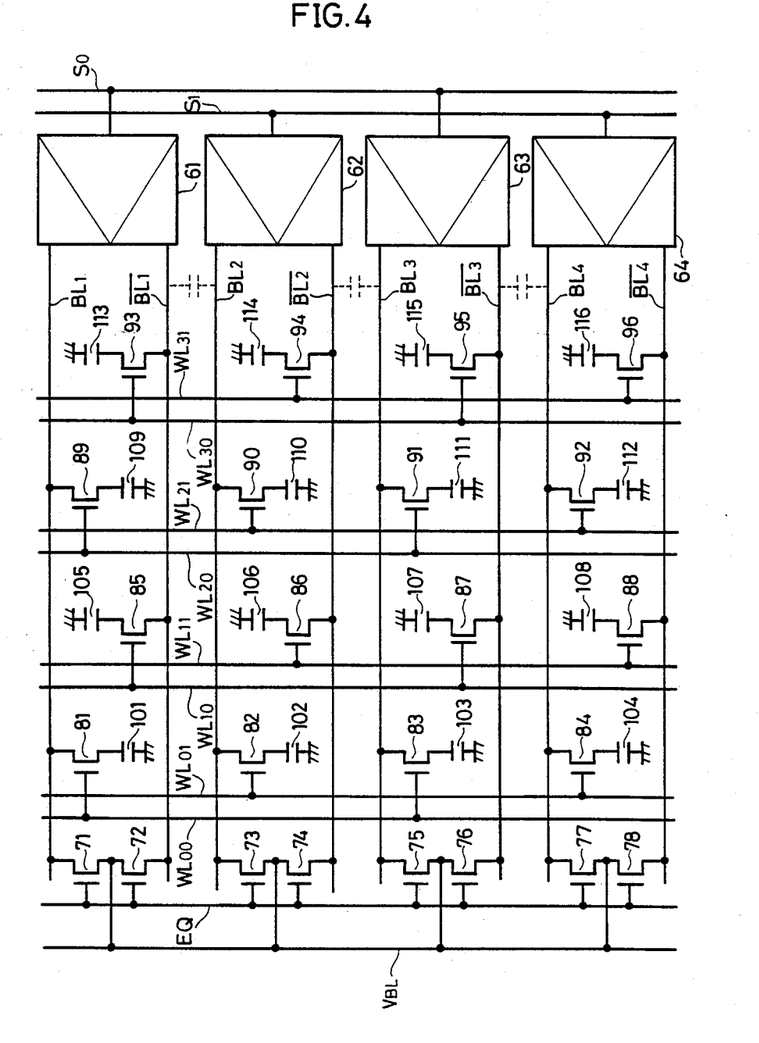
FIG. 4 is a circuit diagram showing a portion of a DRAM device of an embodiment of the present invention.

Referring to FIG. 4, there is shown a circuit diagram for illustrating a portion of a DRAM device of an embodiment of the present invention. Memory capacitors 101 to 116 as well as transfer FETs 81 to 96 corresponding thereto respectively constitute an array of memory cells. Pairs of bit lines adjacent to each other on a semiconductor substrate, namely, BL1 and $\overline{BL1}$ (referred to as BL1-$\overline{BL1}$); BL2 and $\overline{BL2}$ (referred to as BL2-$\overline{BL2}$); BL3 and $\overline{BL3}$ (referred to as BL3-$\overline{BL3}$); and BL4 and BL4 (referred to as BL4-$\overline{BL4}$) are connected to sense amplifiers 61, 62, 63 and 64, respectively, so as to perform reading from and writing into memory cells selected by word lines WL00, WL01, WL10, WL11, WL20, WL21, WL30 and WL31. Each of the word lines selects memory cells related with alternate pairs of bit lines. Corresponding to the selection, the sense amplifiers 61 and 63 are activated by means of a sense amplifier activation signal line S0 and the sense amplifiers 62 and 64 are activated by another sense amplifier activation signal S1 to sense the alternate pairs of bit lines. The pairs of bit lines are equalized by means of an equalizing signal line EQ through FETs 71 to 78 so as to be at a potential Vcc/2 by a signal line $V_{BL}$ in a reliable manner.

Figure 5:
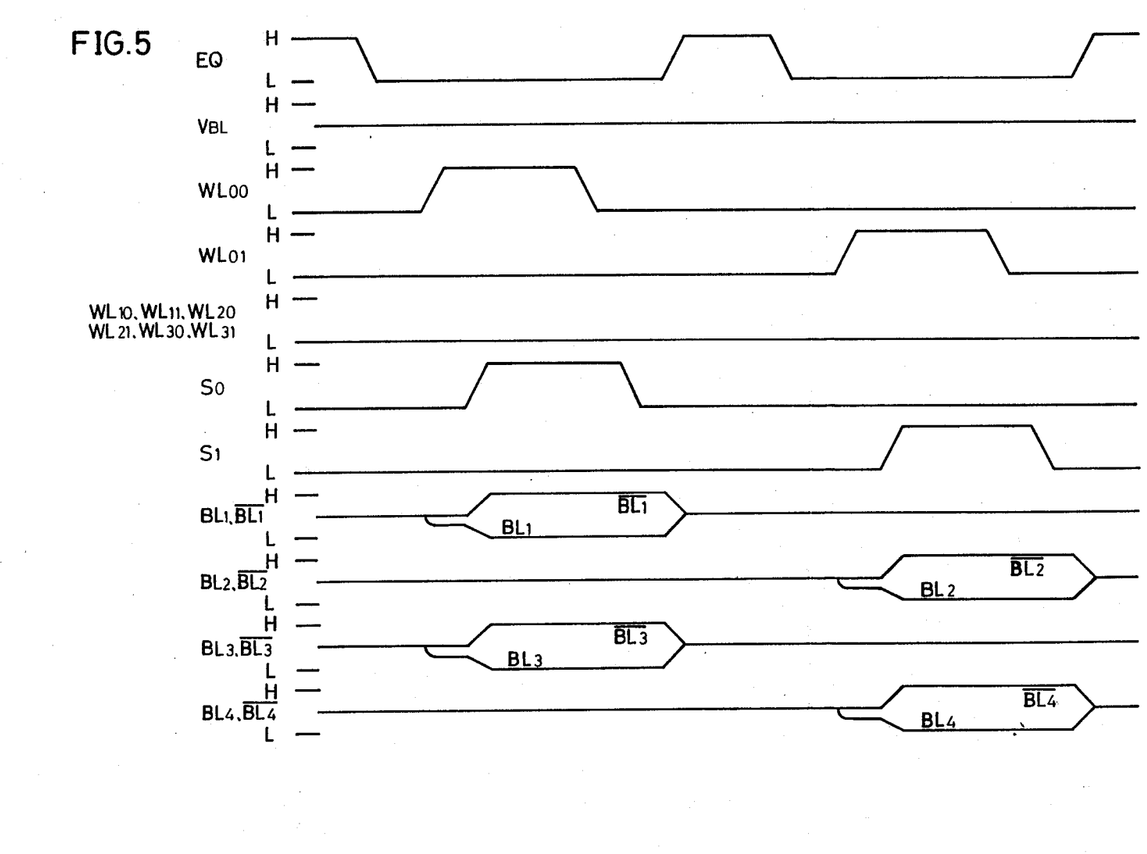
FIG. 5 is a diagram showing waveforms on signal lines in the DRAM device of FIG. 4.

FIG. 5 is a waveform diagram for signal lines in the DRAM device of FIG. 4. When the equalizing signal line EQ is at an H level, all of the bit lines are maintained at the potential Vcc/2 by the signal line $V_{BL}$. For example, if the word line WL00 is selected, the equalizing signal line EQ is turned to an L level and the FETs 71 to 78 are turned off, whereby the pairs of bit lines are electrically separated from the signal line $V_{BL}$. In this state, the word line WL00 is turned to the H level and the data stored in the memory capacitors 101 and 103 are read out onto the bit lines BL1 and BL3, respectively. At this time, the remaining pairs of bit lines BL2-$\overline{BL2}$ and BL4-$\overline{BL4}$ are maintained at the potential Vcc/2 in an electrically floating state. Thus, little loss is caused in the sense margin due to capacitance coupling between the bit lines.

Subsequently, while the sense amplifier activation signal line S1 is maintained at the L level with the sense amplifiers 62 and 64 being in a non-activated state, the sense amplifier activation signal line S0 is turned to the H level to activate the sense amplifiers 61 and 63. As a result, those activated sense amplifiers 61 and 63 turn the bit lines BL1 and BL3 of a low level, for example, to a ground potential GND (L level) and amplify the bit lines $\overline{BL1}$ and $\overline{BL3}$ of a high level to a potential Vcc (H level). Thus, the data in the selected memory cell in the pairs of bit lines BL1-$\overline{BL1}$ and BL3-$\overline{BL3}$ is read out through input/output lines (such as indicated by a reference number 204 in FIG. 11).

Before the selected word line WL00 is returned to the L level, data are written again in the memory capacitors 101 and 103 at the ground level GND (L level) and then the sense amplifier activation signal S0 is returned to the L level. Subsequently, the equalizing signal line EQ is returned to the H level and the pairs of bit lines are equalized so as to be at the potential Vcc/2 by the signal line $V_{BL}$. Then, the DRAM device is ready for the next operation cycle. If the word line WL01 is selected next, the data stored in the memory capacitors 102 and 104 are read out onto the bit lines BL2 and BL4.

In the above described manner, data can be read out from and written into only the memory cells related with the alternate pairs of bit lines for one operation cycle.

Figure 6:
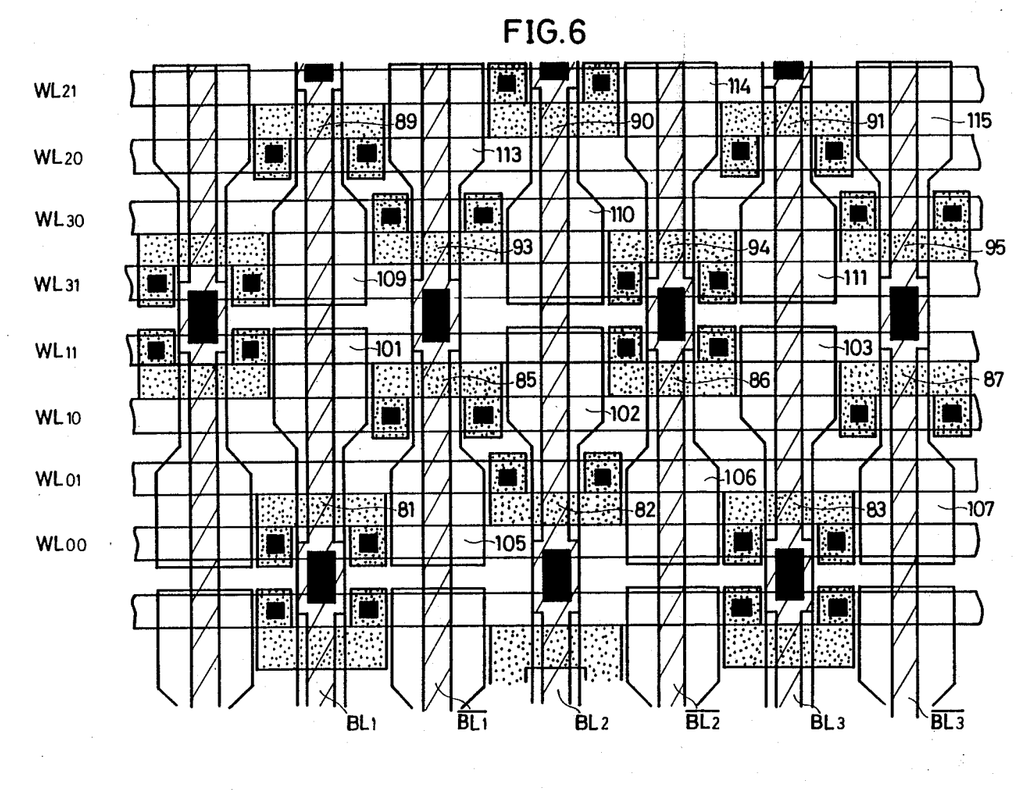
FIG. 6 is a diagram showing a pattern of the DRAM device of FIG. 4 formed on a semiconductor substrate.

FIG. 6 shows a portion of a typical pattern of the DRAM device of FIG. 4 formed on a semiconductor substrate. In FIG. 6, the same reference characters as in FIG. 4 denote the corresponding portions. Bit lines BL1, $\overline{BL1}$ etc. of polysilicon, for example, are connected to drains of the transfer FETs, 81, 82 etc. through contact holes shown by black rectangular areas. Smudged areas represent gate electrodes of the transfer FETs, formed of polysilicon, for example. The word lines WL00, WL01 etc. of aluminum, for example, are connected to gate electrode of the transfer FETs through contact holes represented by small black square areas. As can be clearly seen from FIG. 6, the word lines are connected to the gate electrodes of the transfer FETs of the memory cells related with alternate pairs of bit lines.

Figure 7:
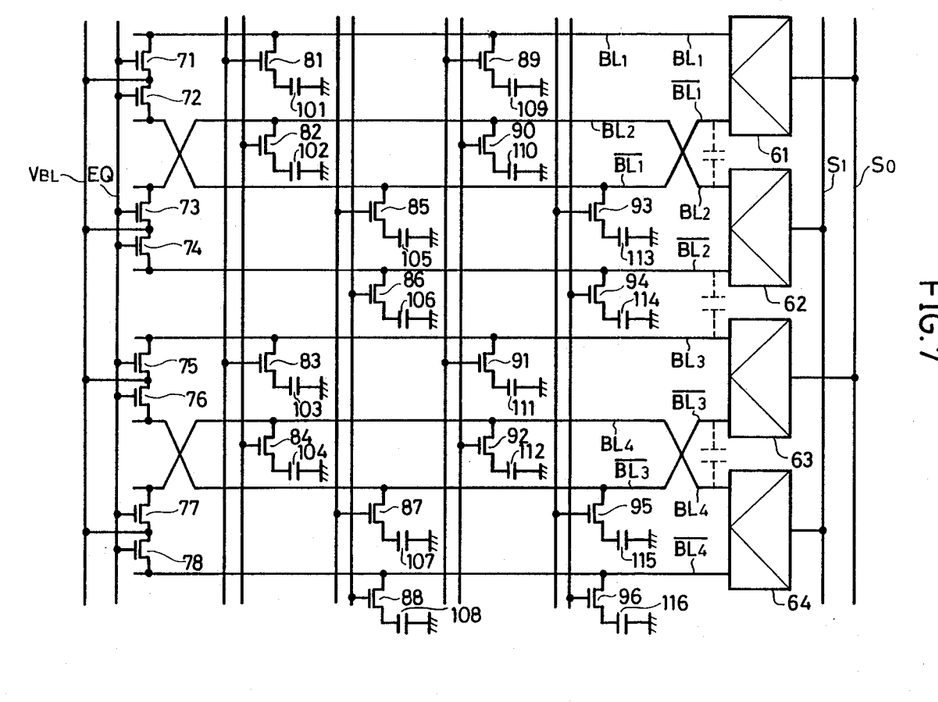
FIG. 7 is a circuit diagram showing a portion of a DRAM device of another embodiment of the present invention.

FIG. 7 is a circuit diagram for illustrating a portion of a DRAM device of another embodiment of the present invention. This DRAM device is similar to the device of FIG. 4, except that bit lines are arranged in the order of BL1, BL2, $\overline{BL1}$, $\overline{BL2}$, BL3, BL4, $\overline{BL3}$ and $\overline{BL4}$. Thus, there is interposed, between the pair of bit lines Bln and $\overline{BLn}$, a bit line BLn+1 or $\overline{BLn-1}$ of another pair. Accordingly, in the device of FIG. 7, a distance between the two bit lines of each pair is increased and a coupling capacitance of each pair becomes smaller. As a result, loss in the sense margin can be further reduced.

Figure 8A:
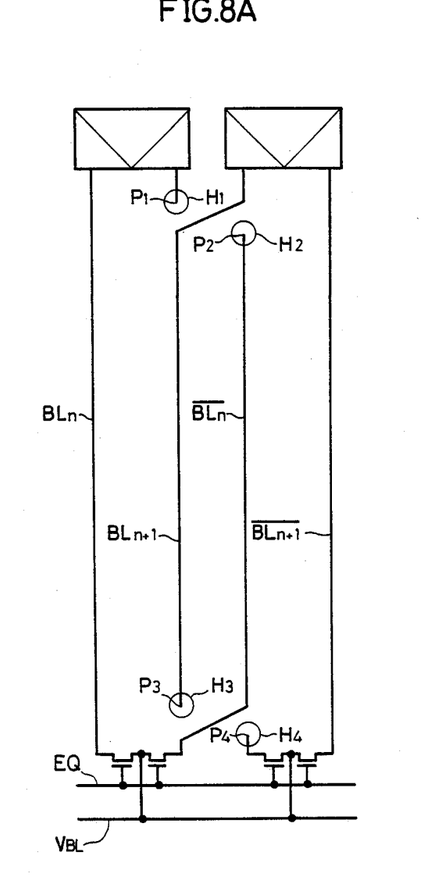
FIG. 8A and 8B are schematic illustrations of a process for forming bit lines which are insulated from each other and intersect.
Figure 8B:
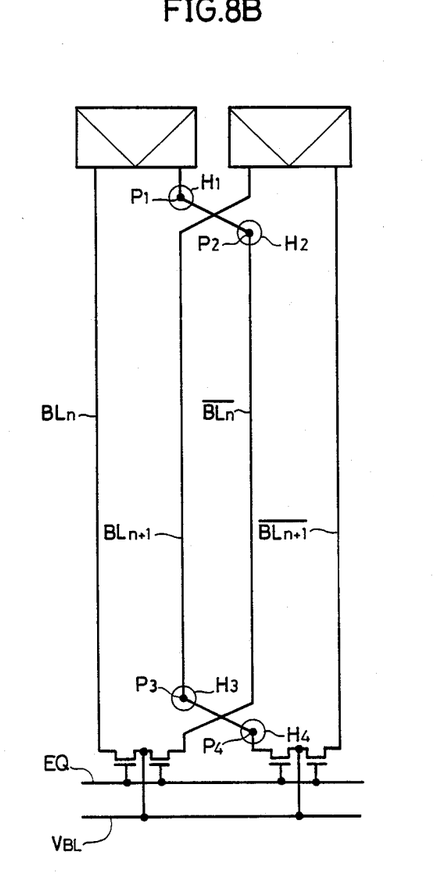

Referring to FIGS. 8A and 8B, there is schematically illustrated a process for forming bit lines which are insulated from each other and intersect. In FIG. 8A, the greater part of the bit lines are formed in a pattern of a first bit line layer, but a bit line $\overline{BLn}$ is open between points P1 and P2, and similarly a bit line BLn+1 is open between points P3 and P4. The first bit line layer is covered with an insulator layer and then contact holes H1 to H4 are opened at the points P1 to P4 respectively. In FIG. 8B, a short segment of the bit line $\overline{BLn}$ is formed on the insulator layer between the points P1 and P2 so that the bit line $\overline{BLn}$ may be closed through the contact holes H1 and H2. Similarly, the bit line BLn+1 is also closed between the points P3 and P4 through the contact holes H3 and H4. As a result, the bit lines $\overline{BLn}$ and $\overline{BLn+1}$ intersect, but are insulated from each other.

Figure 9:
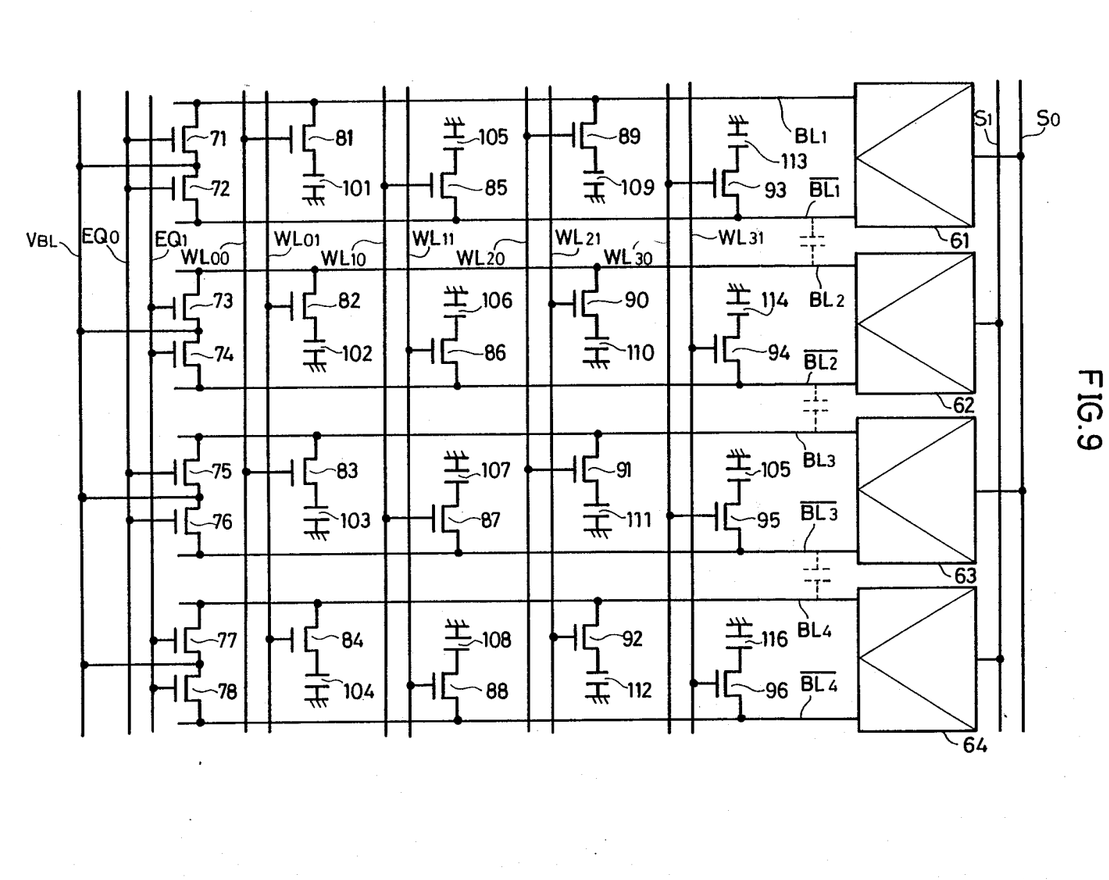
FIG. 9 is a circuit diagram showing a portion of a DRAM device of a further embodiment of the present. invention.

Referring to FIG. 9, there is shown a circuit diagram for illustrating a portion of a DRAM device of a further embodiment of the present invention. This DRAM device is similar to the device of FIG. 4, except that the single equalizing signal line EQ in the device of FIG. 4 are replaced by a pair of equalizing signal lines EQ0 and EQ1. The alternate pairs of bit lines BL1-$\overline{BL1}$ and BL3-$\overline{BL3}$ are equalized by means of the equalizing signal line EQ0 through FETs 71, 72, 75 and 76 so as to be at a potential Vcc/2 by a signal line $V_{BL}$ ion a reliable manner. The other alternate pairs of bit lines BL2-$\overline{BL2}$ and BL4-$\overline{BL4}$ are equalized by means of another equalizing signal EQ1 through FETs 73, 74, 77 and 78 so as to be at the potential Vcc/2 by the signal line $V_{BL}$ in a reliable manner. If memory cells related with alternate pairs of bit lines are selected by a word lines for reading or writing, the other pairs of bit lines are maintained at the potential Vcc/2 by the signal line $V_{BL}$.

Figure 10:
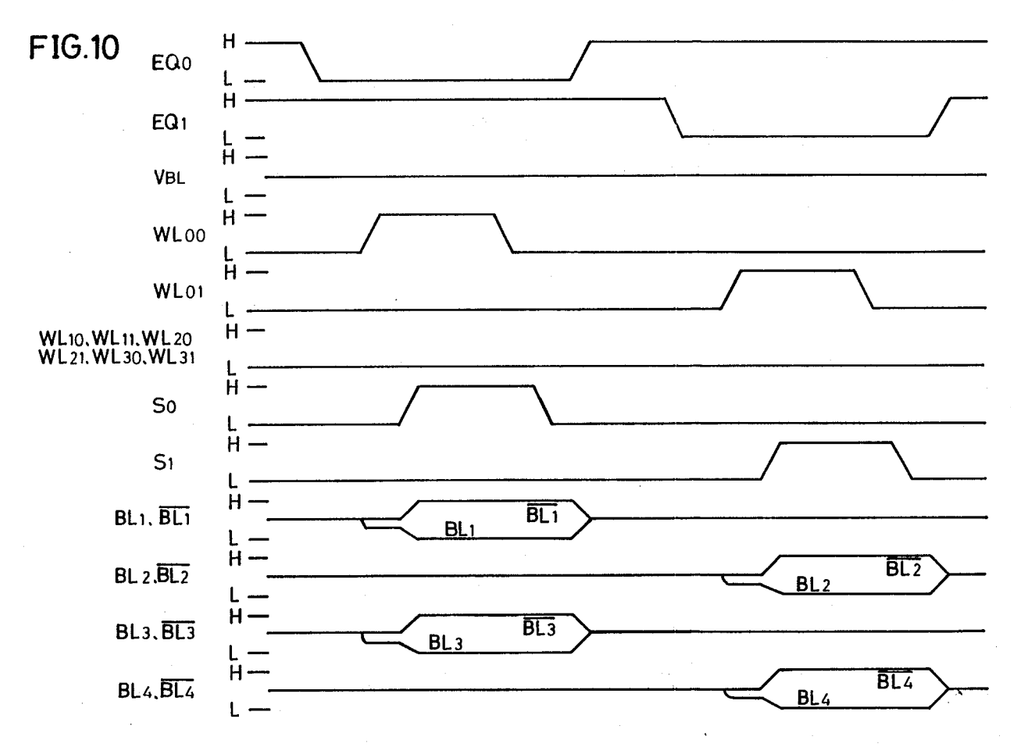
FIG. 10 is a diagram showing waveforms on signal lines in the DRAM device of FIG. 9

FIG. 10 is a waveform diagram for signal lines in the DRAM device of FIG. 9. When both of the equalizing signal lines EQ0 and EQ1 are at the H level, all of the bit lines are maintained at the potential Vcc/2 by the signal line $V_{BL}$. For example, if the word line WL00 is selected, the equalizing signal line EQ0 is turned to the L level and the FETs 71, 72, 75 and 76 are turned off, whereby the alternate pairs of bit lines BL1-$\overline{BL1}$ and BL3-$\overline{BL3}$ are electrically separated from the signal line $V_{BL}$. On the other hand, the equalizing signal line EQ1 is maintained at the H level and the FETs 73, 74, 77 and 78 are maintained in an on state, with the sense amplifier activation signal S1 being at the L level. Accordingly, the other pairs of bit lines BL2-$\overline{BL2}$ and BL4-$\overline{BL4}$ are maintained at the potential Vcc/2 by the signal line $V_{BL}$. Subsequently, the data stored in the memory capacitors 101 and 103 are read out onto the bit lines BL1 and BL2, similarly as in FIG. 5. After the sense amplifier activation signal S0 is returned to the L level, the equalizing signal line EQ0 is returned to the H level and the pairs of bit lines BL1-$\overline{BL1}$ and BL3-$\overline{BL3}$ are equalized so as to be at the potential Vcc/2 by the signal line $V_{BL}$. Then, the DRAM device is ready for the next operation cycle. If the word line WL01 is selected next, the equalizing signal line E01 is turned to the L level and then the data stored in the memory capacitors 102 and 104 are read out onto the bit lines BL2 and BL4.

Figure 11:
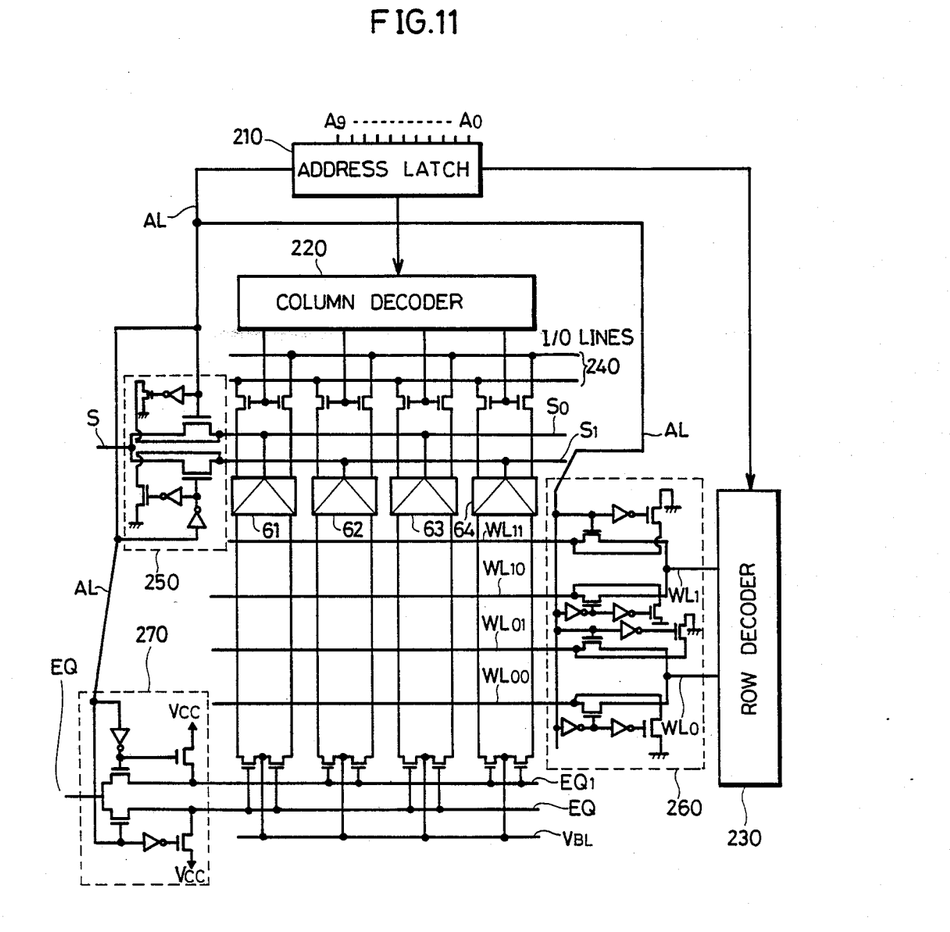
FIG. 11 is a block diagram showing a peripheral circuitry for the DRAM device of the present invention.

FIG. 11 is a block diagram showing a peripheral circuitry for a DRAM device according to the present invention. The peripheral circuitry shown in FIG. 11 is similar to that shown in FIG. 2, but it includes additional circuits 250, 260 and 270. The sense amplifier activation signals S0 and S1 which are required in the present invention can readily be produced from the conventional signal S through the circuit 250. When the address signal A0 is at the H level, the potential of a signal line AL becomes the H level. In this situation, if the sense amplifier activation signals S is at the H level (Vcc), the signal S0 will be at the H level (Vcc) and the signal S1 will be at the L level (GND). On the other hand, when the address signal A0 is a the L level, the potential of the signal line AL becomes the L level. At that time, if the sense amplifier activation signal S is at the H level, the signal S0 will be at the L level and the signal S1 will be at the H level. However, when the sense amplifier activation signal S is at the L level, both the signals S0 and S1 are also at the L level irrespective of the status of the signal line AL. Similarly, the word line signals WL00, WL01, etc. can be produced from the conventional word line signals WL0, etc. through the circuit 260. The equalizing signals EQ0 and EQ1 are also produced from the conventional equalizing signal EQ through the circuit 270. When the equalizing signal EQ is at the H level, both the signals EQ0 and EQ1 are at the H level irrespective of the status of the signal line AL. When the equalizing signal EQ is at the L level, one of the signals EQ0 and EQ1 becomes the L level and the other remains at the H level, depending on the status of the signal line AL.

Accordingly, it can be now appreciated that in accordance with the foregoing, the sense margin and immunity to soft errors in a DRAM device are improved by reducing the effect of capacitance coupling between bit lines of adjacent cells. This is carried out by alternately reading bit lines using two phase control of sense amplifiers and two phase bit line equalization.

Although only four pairs of bit lines were described for charity of explanation in the above embodiments, it goes without saying that a larger number of pairs of bit lines can be included.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device formed on a major surface of a semiconductor substrate, comprising:
   an array of memory cells arranged in rows and columns;
   a plurality of bit line pairs coupled to rows of said memory cells, said plurality of bit line pairs comprising a plurality of first bit line pairs and a plurality of second bit line pairs, said first bit line pairs interposed respectively between said second bit line pairs so that said first and second bit line pairs alternative;
   a plurality of word lines coupled respectively to columns of said memory cells;

equalizing means coupled to said plurality of bit line pairs for equalizing said pairs;

a plurality of first and a plurality of second sense amplifier means coupled respectively to said plurality of first and plurality of second bit line pairs; and control means for activating alternately a plurality of said first amplifier means and a plurality of said second sense amplifier means.

2. A dynamic random access memory device in accordance with claim 1, wherein opposed bit lines of adjacent rows of cells are insulated from each other and intersect.

3. A dynamic random access memory device in accordance with claim 2, wherein intersecting ones of said plurality of bit lines are in alternate rows of said cells.

4. A dynamic random access memory device in accordance with claim, wherein said equalizing means comprises first and second equalizing circuit means connected respectively to said first and second bit line pairs, and wherein said control means further includes means for activating alternately said first and said second equalizing circuit means.

5. A dynamic random access memory device in accordance with claim 4, wherein said first and second equalizing means comprise equalizing circuits, each said equalizing circuit formed of a series connection of first and second transistors between the bit lines of a bit line pair.

6. A dynamic random access memory device in accordance with claim 1, wherein each said memory cell comprises a single transistor and a single capacitor.

7. A dynamic random access memory device in accordance with claim 1, wherein said control means comprises means for generating first and second alternate control signals applied respectively to said first and second sense amplifier means.

8. A dynamic random access memory device in accordance with claim 7, wherein said equalizing means comprises first and second equalizing means coupled respectively to said first and second bit line pairs, and further wherein said control means comprises means for generating alternately third and fourth control signals for activating respectively said first and second equalizing means.

9. In a dynamic random access memory device comprising an array of memory cells arranged in rows and columns;

a plurality of bit line pairs coupled to rows of said memory cells, said plurality of bit line pairs comprising a plurality of first bit line pairs and a plurality of second bit line pairs, said first bit line pairs interposed respectively between said second bit line pairs so that said first and second bit line pairs alternate; a plurality of word lines coupled respectively to columns of said memory cells; equalizing means coupled to said plurality of bit lines pairs for equalizing said pairs; and a plurality of sense amplifier means coupled to each of said first and second plurality of bit line pairs;

a method of reading data from said memory device, comprising the steps of:

controlling said pluralities of sense amplifier means to access alternately said first and second pluralities of bit line pairs so that adjacent bit line pairs are not accessed simultaneously; and detecting outputs of said sense amplifier means.

10. The method of claim 9, including the step of further controlling said equalizing means to equalize alternately said first and second bit line pairs.

11. The method of claim 10, wherein said steps of controlling said sense amplifier means and equalizing means are synchronized with each other.

* * * * *